(12) United States Patent
Kim

(10) Patent No.: US 10,957,369 B2
(45) Date of Patent: Mar. 23, 2021

(54) WORD LINE DRIVERS SHARING A TRANSISTOR, AND RELATED MEMORY DEVICES AND SYSTEMS

(71) Applicant: Micron Technology, Inc., Boise, ID (US)

(72) Inventor: Tae H Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/546,500

(22) Filed: Aug. 21, 2019

(65) Prior Publication Data
US 2021/0057008 A1 Feb. 25, 2021

(51) Int. Cl.
*G11C 8/08* (2006.01)

(52) U.S. Cl.
CPC ...................... *G11C 8/08* (2013.01)

(58) Field of Classification Search
CPC ......................................................... G11C 8/08
See application file for complete search history.

(56) References Cited

U.S. PATENT DOCUMENTS

| | | | | |
|---|---|---|---|---|
| 5,126,970 A * | 6/1992 | Ul Haq | ................ | G11C 11/419 365/154 |
| 5,896,344 A * | 4/1999 | Kirsch | .................... | G11C 8/10 365/189.05 |
| 2007/0008807 A1* | 1/2007 | Jeong | ..................... | G11C 8/08 365/230.06 |
| 2011/0069558 A1* | 3/2011 | Liao | ..................... | G11C 16/08 365/185.23 |
| 2020/0090721 A1* | 3/2020 | Berger | ..................... | G11C 5/14 |

* cited by examiner

*Primary Examiner* — Ajay Ojha
(74) *Attorney, Agent, or Firm* — TraskBritt

(57) ABSTRACT

Systems and memory devices that include a transistor shared by word line drivers are described. A memory device includes a first word line driver coupled to a first word line, and a second word line driver coupled to a second word line. The memory device also includes a transistor comprising a first terminal coupled to an output of the first word line driver, and a second terminal coupled to an output of the second word line driver.

14 Claims, 11 Drawing Sheets

WORD LINE DRIVERS SHARING A TRANSISTOR, AND RELATED MEMORY DEVICES AND SYSTEMS

TECHNICAL FIELD

Embodiments of the disclosure relate to word line driver circuitry. More specifically, to word line driver circuitry including at least two word line drivers sharing a transistor, and to related memory modules, memory devices, semiconductor devices, and systems.

BACKGROUND

Improving area efficiency of a memory device is an ongoing goal. The area efficiency of a memory device is the area of the memory including memory cells compared to the total area of the memory device that includes other peripheral circuitry. As such, area efficiency may be improved by reducing an area of the peripheral circuitry.

One example of peripheral circuitry in a memory device is a word line driver. Memory devices may include numerous word line drivers associated with numerous word lines (i.e., access lines) in a memory bank. Word line drivers selectively charge and discharge one or more word lines in a memory bank by selectively opening/closing transistors of the respective word line drivers. Accordingly, reducing the area of one or more word line drivers in a memory device may increase the area efficiency of the memory device.

BRIEF DESCRIPTION OF THE DRAWINGS

FIG. 6 is a logic table associated with the word line driver system of FIG. 5, in accordance with various embodiments of the present disclosure.

DETAILED DESCRIPTION

As described above, word line drivers selectively charge and discharge (e.g., activate/deactivate) one or more word lines in a memory bank by selectively opening/closing transistors of the respective word line drivers. As described above, reducing the area of word line drivers in a memory device may increase the area efficiency of the memory device.

In various embodiments described herein, a memory device includes a first word line driver and a second word line driver that share a transistor. By sharing a transistor (rather than the first word line driver and the second word line driver separately including an additional dedicated transistor), the area efficiency of a memory device that includes the word line drivers is increased. More specifically, for example, the area efficiency of a throat layout area of a memory device may be increased. In general, the throat layout area includes word line drivers, described herein, and memory sense amplifier control circuits. The circuit units (that include the word line drivers and the memory sense amplifier control circuits), in some embodiments, are assigned to control memory sub-array units that are repeated by the number of sub-array units.

Figure 1:
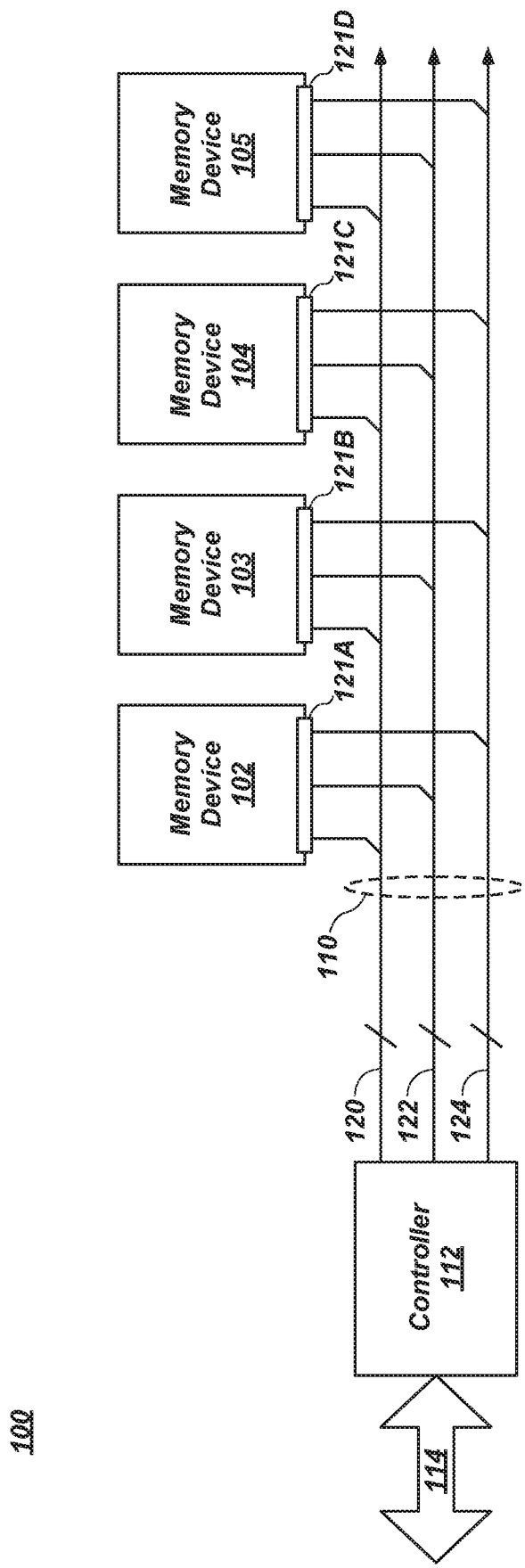
FIG. 1 is a block diagram of a memory system including a number of memory devices, in accordance with various embodiments of the present disclosure.

FIG. 1 illustrates a memory system 100, according to various embodiments of the present disclosure. Memory system 100 includes a number of memory devices 102, 103, 104 and 105 coupled to a communication bus 110 (e.g., a system bus). Each memory device 102-105 may include one or more memory die, and collectively, memory devices 102-105 may be referred to as a memory module (e.g., a dual in-line memory module (DIMM)), a multi-chip package (MCP) or a package on package (POP).

Memory system 100 further includes a controller 112 coupled to each memory device 102-105 via communication bus 110. Controller 112, which may include a processor or any other suitable type of controller, may be configured to control and/or regulate various operations of memory system 100, as well as provide interactivity with another device or system coupled to memory system 100 via an interface 114.

Communication bus 110 may include one or more of an address bus 120, a data bus 122, and a control signal bus 124. In some embodiments, memory devices 102-105, communication bus 110, and controller 112 may be configured (e.g., physically arranged and mounted) on a printed circuit board (PCB). In various embodiments, memory system 100 may include a DIMM and one or more memory devices 102-105 may be a rank (or a number of ranks) of the DIMM.

According to some embodiments of the present disclosure, at least some of memory devices 102-105 may be coupled to communication bus 110 via an associated interface 121A-121D (referred to collectively as interface 121). For example, interface 121 (any one of interface 121A-121D) may include one or more nodes (e.g., input/output (I/O) nodes) for coupling signal lines of an associated memory device to respective signal lines of communication bus 110. Further, interface 121 may include one or more nodes coupled to one or more power supplies (not shown in FIG. 1), such as, for example, power and/or reference potentials. For example, each interface 121 may include an electromechanical type connection or soldered lead connection to communication bus 110.

A memory device (e.g., memory device 102) may be in an active mode in response to the memory device being selected to drive data bus 122 to a particular state, such as in response to performing a read operation in the memory device. Further, the memory device (e.g., memory device 102) may be in an inactive mode when another memory device (e.g., memory device 104) is selected to drive data bus 122 to a particular state, such as in response to performing a read operation in the other memory device (e.g., memory device 104).

Figure 2:
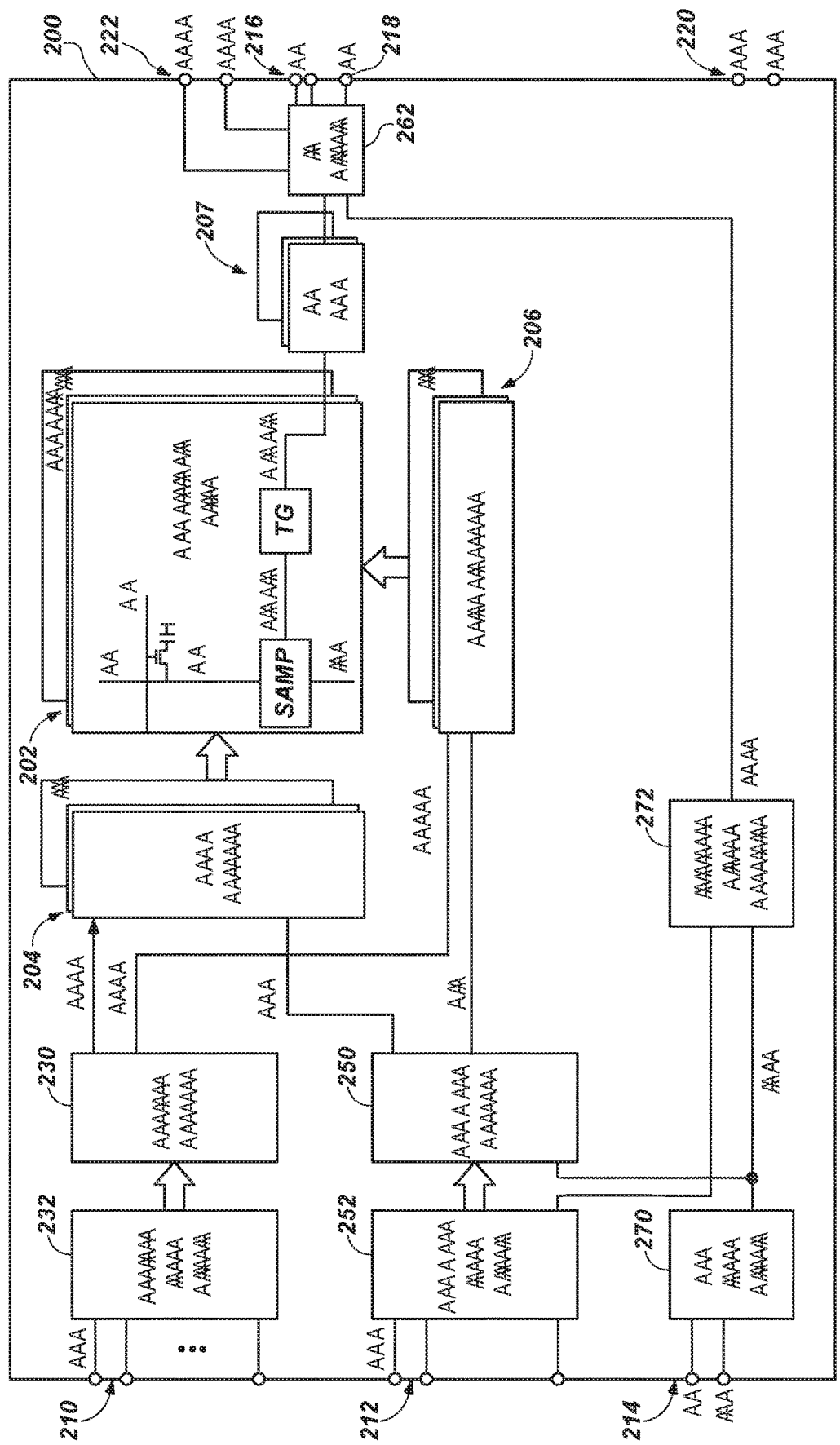
FIG. 2 is a block diagram of an example memory device, according to various embodiments of the present disclosure.

FIG. 2 illustrates a memory device 200, according to various embodiments of the present disclosure. Memory device 200, which may include, for example, a DRAM (dynamic random access memory), a SRAM (static random access memory), a SDRAM (synchronous dynamic random access memory), a DDR SDRAM (double data rate DRAM, such as a DDR4 SDRAM and the like), or a SGRAM (synchronous graphics random access memory), may be part of memory system 100 of FIG. 1. For example, memory device 200 may include one of memory devices 102-105 of FIG. 1. Memory device 200, which may be integrated on a semiconductor chip, may include a memory array 202.

In the embodiment of FIG. 2, memory array 202 is shown as including eight memory banks BANK0-7. More or fewer banks may be included in memory array 202 of other embodiments. Each memory bank includes a number of access lines (word lines WL), a number of data lines (bit lines BL) and/BL, and a number of memory cells MC arranged at intersections of the number of word lines WL and the number of bit lines BL and/BL. The selection of a word line WL may be performed by a row decoder 204 and the selection of the bit lines BL and/BL may be performed by a column decoder 206. In the embodiment of FIG. 1, row decoder 204 may include a respective row decoder for each memory bank BANK0-7, and column decoder 206 may include a respective column decoder for each memory bank BANK0-7.

Bit lines BL and/BL are coupled to a respective sense amplifier SAMP. Read data from bit line BL or/BL may be amplified by sense amplifier SAMP, and transferred to read/write amplifiers 207 over complementary local data lines (LIOT/B), transfer gate (TG), and complementary main data lines (MIOT/B). Conversely, write data outputted from read/write amplifiers 207 may be transferred to sense amplifier SAMP over complementary main data lines MIOT/B, transfer gate TG, and complementary local data lines LIOT/B, and written in memory cell MC coupled to bit line BL or/BL.

Memory device 200 may be generally configured to be receive various inputs (e.g., from an external controller) via various terminals, such as address terminals 210, command terminals 212, clock terminals 214, data terminals 216, and data mask terminals 218. Memory device 200 may include additional terminals such as power supply terminals 220 and 222.

During a contemplated operation, one or more command signals COM, received via command terminals 212, may be conveyed to a command decoder 250 via a command input circuit 252. Command decoder 250 may include a circuit configured to generate various internal commands via decoding one or more command signals COM. Examples of the internal commands include an active signal ACT and a read/write signal R/W.

Further, one or more address signals ADD, received via address terminals 210, may be conveyed to an address decoder 230 via an address input circuit 232. Address decoder 230 may be configured to supply a row address XADD to row decoder 204 and a column address YADD to column decoder 206.

Active signal ACT may include a pulse signal that is activated in response to a command signal COM indicating row access (e.g., an active command). In response to active signal ACT, row decoder 204 of a specified bank address may be activated. As a result, the word line WL specified by row address XADD may be selected and activated.

Read/write signal R/W may include a pulse signal that is activated in response to a command signal COM indicating column access (e.g., a read command or a write command). In response to read/write signal R/W, column decoder 206 may be activated, and the bit line BL specified by column address YADD may be selected.

In response to active signal ACT, a read signal, a row address XADD, and a column address YADD, data may be read from memory cell MC specified by row address XADD and column address YADD. The read data may be output via a sense amplifier SAMP, a transfer gate TG, read/write amplifier 207, an input/output circuit 262, and data terminal 216. Further, in response to active signal ACT, a write signal, a row address XADD, and a column address YADD, write data may be supplied to memory array 202 via data terminal 216, input/output circuit 262, read/write amplifier 207, transfer gate TG, and sense amplifier SAMP. The write data may be written to memory cell MC specified by row address XADD and column address YADD.

Clock signals CK and/CK may be received via clock terminals 214. A clock input circuit 270 may generate internal clock signals ICLK based on clock signals CK and ICK. Internal clock signals ICLK may be conveyed to various components of memory device 200, such as command decoder 250 and an internal clock generator 272. Internal clock generator 272 may generate internal clock signals LCLK, which may be conveyed to input/output circuit 262 (e.g., for controlling the operation timing of input/output circuit 262). Further, data mask terminals 218 may receive one or more data mask signals DM. When data mask signal DM is activated, overwrite of corresponding data may be prohibited.

Figure 3:
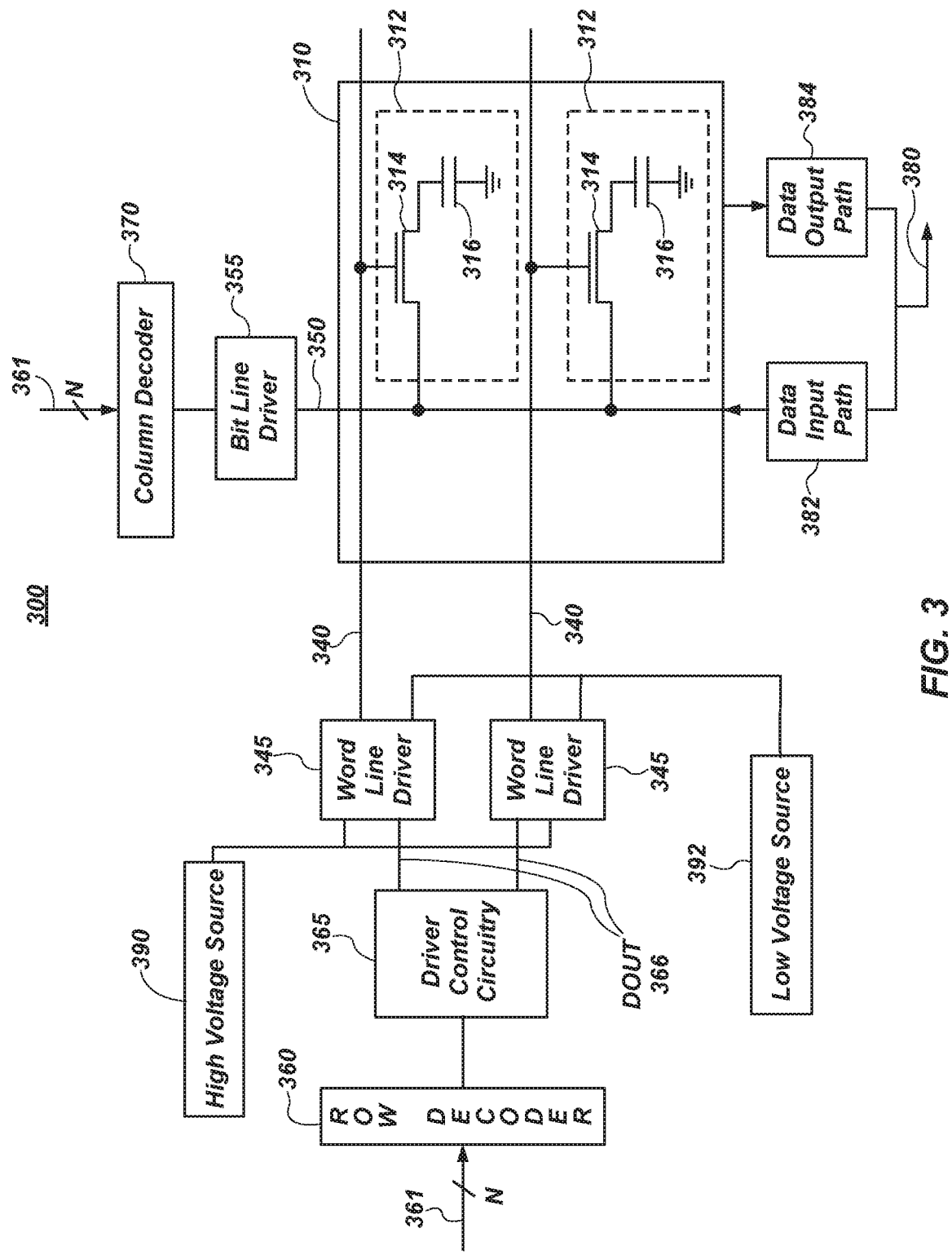
FIG. 3 is a block diagram of an example memory device, according to various embodiments of the present disclosure.

FIG. 3 illustrates a memory device 300, according to various embodiments of the present disclosure. Memory device 300, which may be part of memory device 200 of FIG. 2, includes word line driver circuitry including word line drivers 345 and driver control circuitry 365. Memory device 300 includes a portion of memory circuitry 310 with two memory cells 312 arranged side-by-side. It is understood that memory circuitry 310 (e.g., memory array 202 in FIG. 2) typically includes a number of memory cells arranged in rows and columns, but only two such memory cells are shown here for simplicity. Memory circuitry 310 includes word lines 340 and a bit line 350 disposed adjacent to the rows and columns of memory cells 312. It is understood that memory circuitry 310 generally includes a number of word lines and bit lines, but only two word lines and one bit line are shown here for simplicity. In various embodiments, each memory cell 312 includes a pass gate transistor 314 having its gate connected to word line 340, its drain connected to bit line 350, and its source connected to capacitor 316. Each word line 340 is driven by a word line driver 345 and each bit line 350 is driven by a bit line driver 355.

Row decoder 360 and column decoder 370 decode address signals on address lines 361 to access memory cells 312. Data may be provided to memory cells 312 via a data input path 382 and may be retrieved from memory cells 312 via a data output path 384. Data being transmitted to and from data input path 382 and data output path 384 may be carried on data lines 380.

Each word line driver 345 may be controlled by driver control circuitry 365. Driver control circuitry 365 receives signals from row decoder 360 that indicate which word line drivers 345 apply activation voltages and which word line drivers 345 apply deactivation voltages to word lines 340. The signals provided by control circuitry 365 to word line driver 345 are decoded signals, referred to as DOUT 366 (also referred herein as pre-decoding signals).

In one embodiment, when control circuitry 365 conveys a HIGH (e.g., a logic state HIGH) DOUT 366 to a word line driver, the word line driver 345 applies an activation voltage to the word line or word lines it is driving. The activation voltage (e.g., $V_{CC}$ or $V_{CCP}$) may be provided by high voltage source 390, which is connected to word line driver 345. The activation voltage is applied to word line 340 to perform a memory access function (e.g., read or write function) on a particular memory cell 312. The activation voltage activates pass gate transistor 314 (i.e., turns pass gate transistor 314 ON) to enable data transfer between memory cell 312 and data paths 382 and 384.

When no memory access function is being performed (e.g., standby mode), word line driver 345 may apply a deactivation voltage to word line 340. The deactivation voltage (e.g., a ground voltage or a negative voltage) may be provided by low voltage source 392, which is connected to word line driver 345. The application of a deactivation voltage turns pass gate transistor 314 OFF, thereby preventing any memory access function from being performed on memory cell 312.

Alternatively, in some embodiments, DOUT 366 instructs a word line driver to apply an activation voltage that is provided by low voltage source 392. As such, the activation voltage (e.g., a ground voltage or a negative voltage) activates pass gate transistor 314 (e.g., a PMOS transistor) to enable data transfer between memory cell 312 and data paths 382 and 384. Additionally, in some embodiments, DOUT 366 instructs a word line driver to apply a deactivation voltage that may be provided by high voltage source 390. As such, the deactivation voltage (e.g., Vccp) turns pass gate transistor 314 (e.g., a PMOS transistor) OFF, thereby preventing any memory access function from being performed on memory cell 312.

Figure 4A:
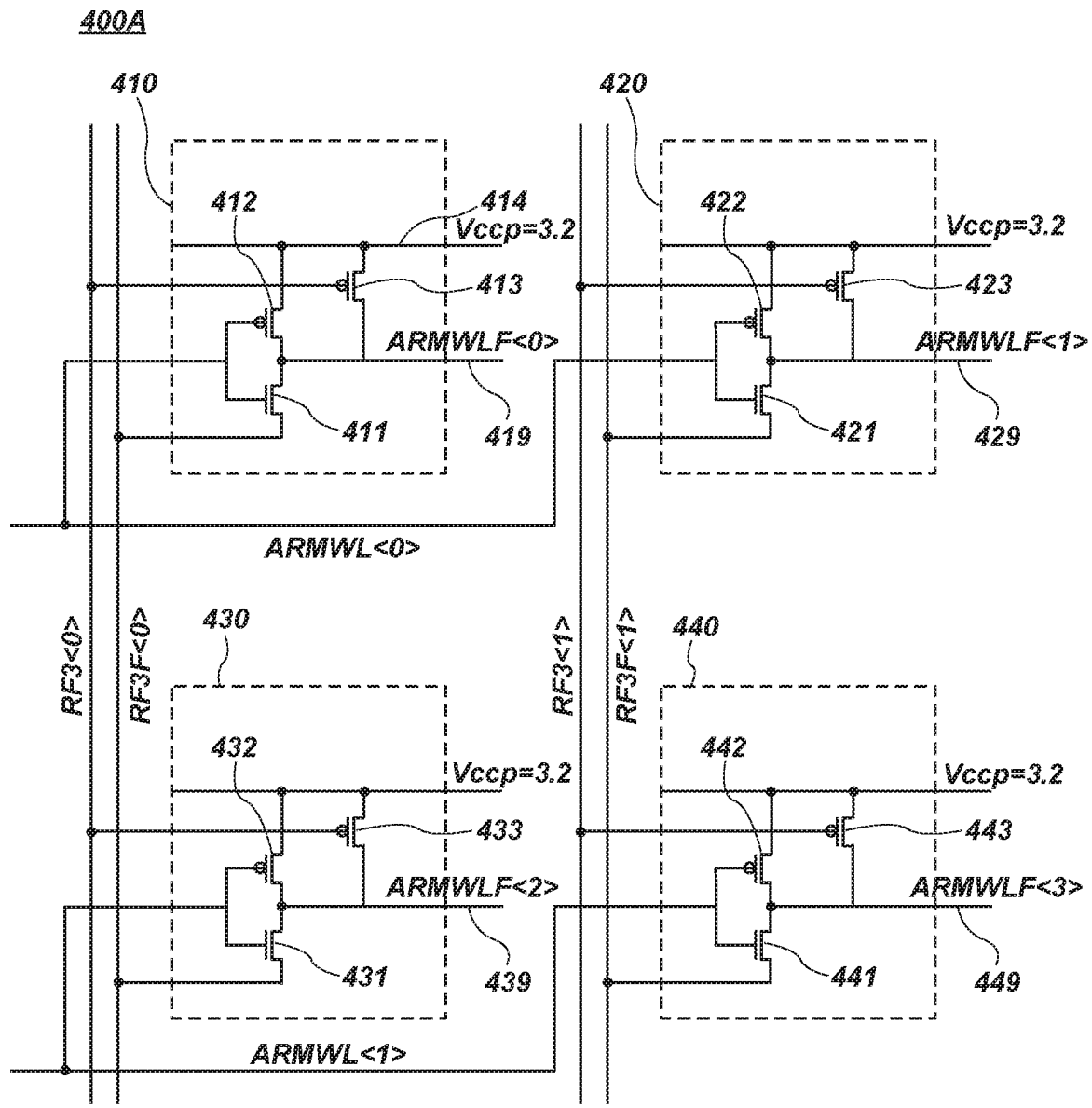
FIG. 4A is a schematic of a conventional word line driver system.

FIG. 4A is a diagram of a conventional word line driver system 400A. Word line driver system 400A includes word line driver 410 coupled to word line 419, word line driver 420 coupled to word line 429, word line driver 430 coupled to word line 439, and word line driver 440 coupled to word line 449. Word line drivers, depicted in FIG. 4A, are main word line drivers.

Each word line driver illustrated in FIG. 4A includes three transistors that are selectively turned ON/OFF which results in the desired output signal (e.g., voltage signal) of the respective word line driver to activate or deactivate a respective word line. In various embodiments, word line driver 410 drives an output voltage (e.g., ARMWLF<0>) to activate/deactivate word line 419, word line driver 420 drives an output voltage (e.g., ARMWLF<1>) to activate/deactivate word line 429, word line driver 430 drives an output voltage (e.g., ARMWLF<2>) to activate/deactivate word line 439, and word line driver 440 drives an output voltage (e.g., ARMWLF<3>) to activate/deactivate word line 449.

It should be appreciated that each word line driver illustrated in FIG. 4A comprises the same circuitry. For example, word line driver 410 includes transistor 411, transistor 412 and transistor 413. Word line driver 420 includes transistor 421, transistor 422 and transistor 423. Word line driver 430 includes transistor 431, transistor 432 and transistor 433. Word line driver 430 includes transistor 441, transistor 442 and transistor 443.

At word line driver 410, a drain of transistor 411 (e.g., an NMOS transistor) is coupled to a drain of transistor 412 (e.g., a PMOS transistor). The respective drains of transistor 411 and transistor 412 are coupled to word line 419. Additionally, a drain of transistor 413 (e.g., a PMOS transistor) is also coupled to word line 419 and a source of transistor 413 is coupled to power supply 414 (e.g., Vccp).

At word line driver 420, a drain of transistor 421 (e.g., an NMOS transistor) is coupled to a drain of transistor 422 (e.g., a PMOS transistor). The respective drains of transistor 421 and transistor 422 are coupled to word line 429. Additionally, a drain of transistor 423 (e.g., a PMOS transistor) is also coupled to word line 429 and a source of transistor 423 is coupled to a power supply (e.g., Vccp).

At word line driver 430, a drain of transistor 431 (e.g., an NMOS transistor) is coupled to a drain of transistor 432 (e.g., a PMOS transistor). The respective drains of transistor 431 and transistor 432 are coupled to word line 439. Additionally, a drain of transistor 433 (e.g., a PMOS transistor) is also coupled to word line 439 and a source of transistor 433 is coupled to a power supply (e.g., Vccp).

At word line driver 440, a drain of transistor 441 (e.g., an NMOS transistor) is coupled to a drain of transistor 442 (e.g., a PMOS transistor). The respective drains of transistor 441 and transistor 442 are coupled to word line 449. Additionally, a drain of transistor 443 (e.g., a PMOS transistor) is also coupled to word line 449 and a source of transistor 443 is coupled to a power supply (e.g., Vccp).

Each word line driver receives input signals (e.g., pre-decoding signals) to selectively turn ON/OFF the respective transistors. Examples of pre-decoding signals are ARMWL, RF3 and RF3F. Referring to word line driver 410, a gate of transistor 411 and a gate of transistor 412 each receive ARMWL<0> and a gate of transistor 413 receives RF3<0>. At word line driver 420, a gate of transistor 421 and a gate of transistor 422 each receive ARMWL <0>, and a gate of transistor 423 receives RF3<1>. At word line driver 430, a gate of transistor 431 and a gate of transistor 432 each receive ARMWL <1>, and a gate of transistor 433 receives RF3<0>. At word line driver 440, a gate of transistor 441 and a gate of transistor 442 each receive ARMWL <1>, and a gate of transistor 443 receives RF3<1>.

Each source of the transistors is operably coupled to receive an input voltage (e.g., supply voltage or pre-decoding signal). This draws a respective drain to a HIGH or LOW voltage (when the respective transistor is turned ON). For example, at word line driver 410, a source of transistor 412 and a source of transistor 413 are operably coupled to a supply voltage, such as Vccp (e.g., 3.2V). A source of transistor 411 is configured to receive RF3F<0>. RF3F is a complement of RF3. For example, if RF3 is HIGH (e.g., 3.2V) then RF3F is LOW (e.g., 0V). Similarly, if RF3 is LOW (e.g., 0V) then RF3F is HIGH (e.g., 3.2V).

At word line 420 a source of transistor 422 and a source of transistor 423 are operably coupled to a supply voltage, such as Vccp. A source of transistor 421 is configured to receive RF3F<1>. At word line 430 a source of transistor 432 and a source of transistor 433 are operably coupled to a supply voltage, such as Vccp. A source of transistor 431 is configured to receive RF3F<0>. At word line 440 a source of transistor 442 and a source of transistor 443 are operably coupled to a supply voltage, such as Vccp. A source of transistor 441 is configured to receive RF3F<1>.

Figure 4B:
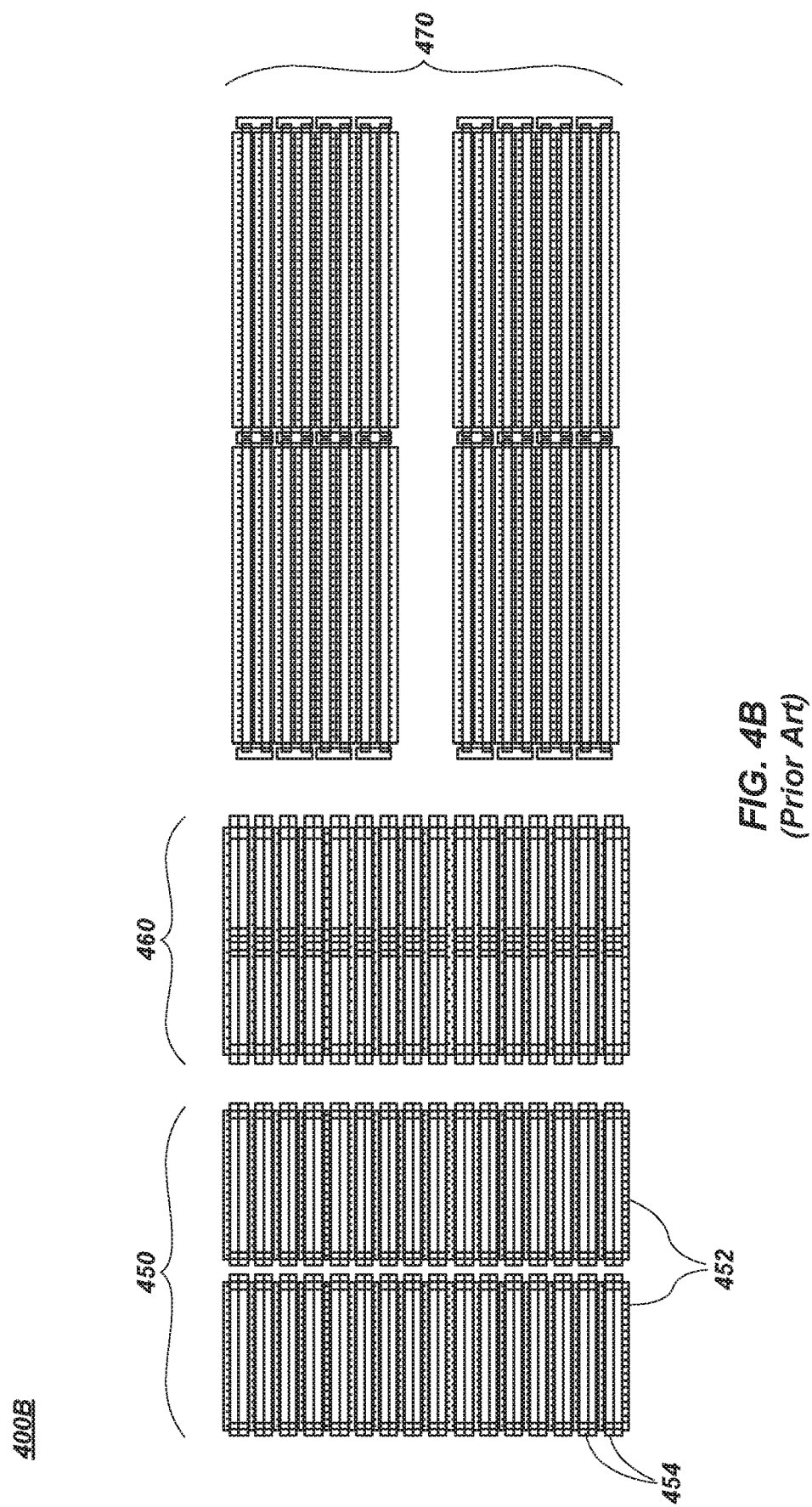
FIG. 4B is a schematic illustrating transistor placement of the conventional word line driver system shown in FIG. 4A.

FIG. 4B is a diagram illustrating transistor placement of a conventional word line driver system 400B. Word line driver system 400B includes 16 word line drivers. For example, word line driver system 400B includes four word line driver systems 400A (see FIG. 4A). Word line driver system 400B includes 16 PMOS transistors 450, 16 PMOS transistors 460 and 16 NMOS transistors 470. The transistor placement of word line driver system 400B shows active areas (e.g., source and drain of respective transistors) and gates of respective transistors. For example, PMOS transistors 450 includes active areas 452 (e.g., source and drain of 16 PMOS transistors) and gates 454 (e.g., gates of 16 PMOS transistors).

Figure 5:
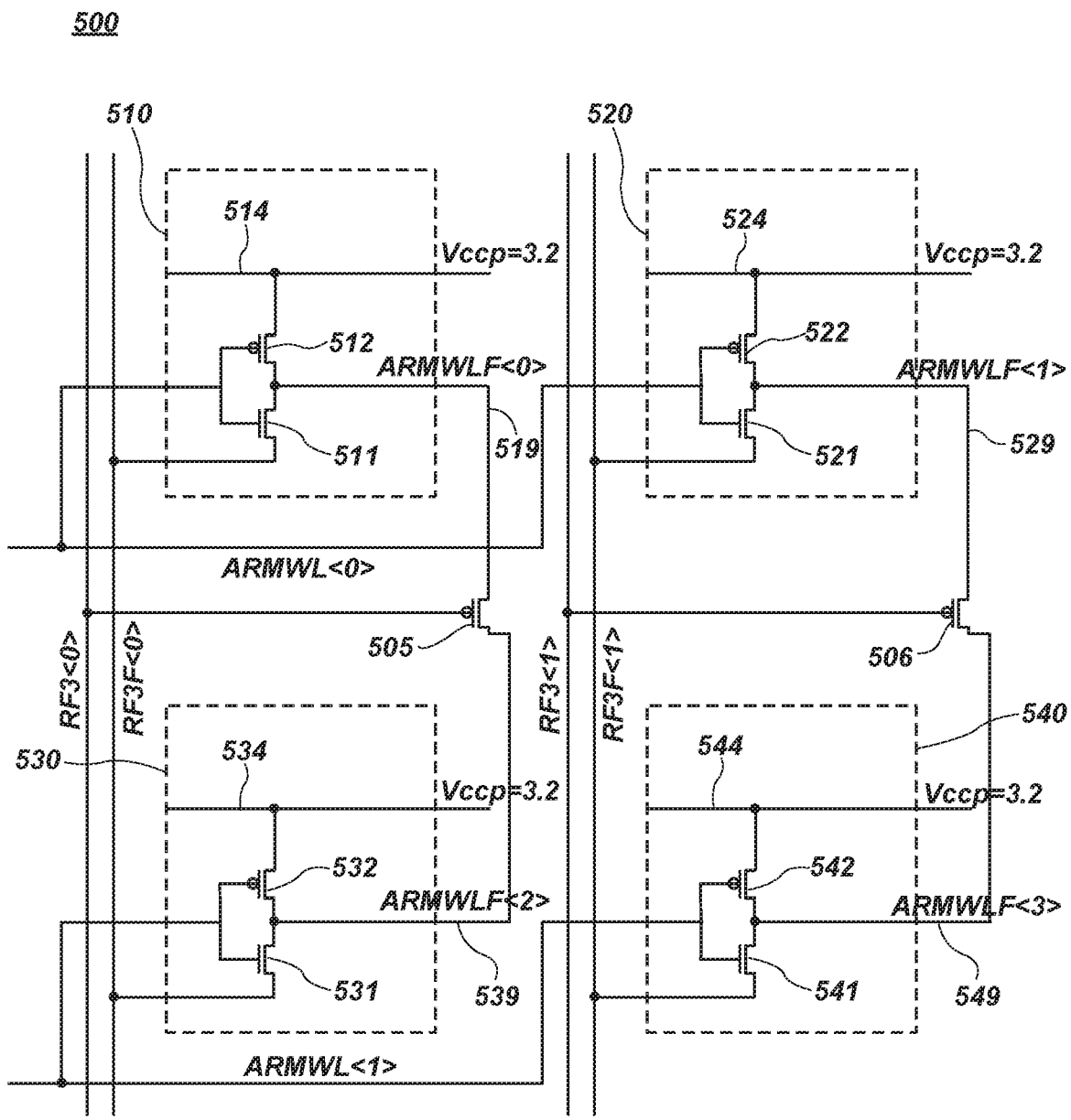
FIG. 5 is a schematic of an example word line driver system, in accordance with various embodiments of the present disclosure.

FIG. 5 is a diagram of word line driver system 500, according to various embodiments of the present disclosure. Word line driver system 500 includes a number of word line drivers coupled to respective word lines of a memory array. For example, each word line driver of word line driver system 500 includes two transistors (e.g., an NMOS transistor and a PMOS transistor) coupled at their respective drains, similar to word line driver system 400A of FIG. 4A. However, in contrast to word line driver system 400A, a pair of word line drivers (e.g., word line driver 510 and word line driver 530) of word line driver system 500 share a transistor. More specifically, word line driver 510 and word line driver 530 share a transistor, and word line driver 520 and word line driver 540 share a transistor. Accordingly, in various embodiments, each word line driver of word line driver system 500 includes two dedicated transistors (i.e., rather than three dedicated transistors). As a result, the area efficiency of word line drivers in word line driver system 500 is increased as compared to the area efficiency of conventional word line drivers, such as word line driver system 400A of FIG. 4A.

Word line driver system 500 includes word line driver 510 coupled to word line 519, word line driver 520 coupled to word line 529, word line driver 530 coupled to word line 539, and word line driver 540 coupled to word line 549.

Each word line driver includes two transistors that are selectively turned ON/OFF (in addition to a shared transistor that is also selectively turned ON/OFF) which results in a desired output signal (e.g., a voltage signal, referred to as ARMWLF) of the respective word line driver to activate or deactivate a respective word line. It should be appreciated that each word line driver comprises the same (or similar) circuitry. For example, word line driver 510 includes transistor 511 and transistor 512. Word line driver 520 includes transistor 521 and transistor 522. Word line driver 530 includes transistor 531 and transistor 532. Word line driver 540 includes transistor 541 and transistor 542.

Additionally, a pair of word line drivers, in word line driver system 500, share a transistor. For example, word line driver 510 and word line driver 530 share transistor 505, and word line driver 520 and word line driver 540 share transistor 506. It should be appreciated that transistor 505 takes the place of transistors 413 of word line driver 410 and transistor 433 of word line driver 430 (see FIG. 4A) and transistor 506 takes the place of the transistor 423 of word line driver 420 and transistor 443 of word line driver 440 (see FIG. 4A).

Transistor 505 (e.g., a PMOS transistor) includes a source coupled to an output of word line driver 510 (that is coupled to word line 519) and a drain coupled to an output of word line driver 530 (that is coupled to word line 539). Similarly, transistor 506 (e.g., a PMOS transistor) includes a source coupled to an output of word line driver 520 (that is coupled to word line 529) and a drain coupled to an output of word line driver 540 (that is coupled to word line 549).

At word line driver 510, a drain of transistor 511 (e.g., an NMOS transistor) is coupled to a drain of transistor 512 (e.g., a PMOS transistor). The respective drains of transistor 511 and transistor 512 are coupled to word line 519. At word line driver 520, a drain of transistor 521 (e.g., an NMOS transistor) is coupled to a drain of transistor 522 (e.g., a PMOS transistor). The respective drains of transistor 521 and transistor 522 are coupled to word line 529. At word line driver 530, a drain of transistor 531 (e.g., an NMOS transistor) is coupled to a drain of transistor 532 (e.g., a PMOS transistor). The respective drains of transistor 531 and transistor 532 are coupled to word line 539. At word line driver 540, a drain of transistor 541 (e.g., an NMOS transistor) is coupled to a drain of transistor 542 (e.g., a PMOS transistor). The respective drains of transistor 541 and transistor 542 are coupled to word line 549.

Each word line driver (and shared transistors) receives input signals (e.g., pre-decoding signals) to selectively turn ON/OFF the respective transistors. Examples of input signals (e.g., pre-decoding signals) are ARMWL, RF3 and RF3F (similar to word line driver system 400A). At word line driver 510, respective gates of transistor 511 and transistor 512 each receive ARMWL<0>. At word line driver 520, respective gates of transistors 521 and 522 receive ARMWL <0>. At word line driver 530, respective gates of transistors 531 and 532 receive ARMWL <1>. At word line driver 540, respective gates transistors 541 and 542 receive ARMWL <1>. Additionally, a gate of transistor 505 receives RF3<0> (similar to transistor 413 and transistor 433, see FIG. 4A) and a gate of transistor 506 receives RF3<1> (similar to transistor 423 and 443, see FIG. 4A).

Each source of the transistors are operably coupled to receive an input voltage (e.g., supply voltage or pre-decoding signal) to pull a voltage, at the drain, to a HIGH or LOW voltage (when the respective transistor is turned ON). For example, at word line driver 510, a source of transistor 512 is operably coupled to power supply 514, such as Vccp (e.g., 3.2V). A source of transistor 511 is configured to receive RF3F<0>. At word line driver 520, a source of transistor 522 is operably coupled to power supply 524, such as Vccp. A source of transistor 521 is configured to receive RF3F<1>. At word line driver 530, a source of transistor 532 is operably coupled to power supply 534, such as Vccp. A source of transistor 531 is configured to receive RF3F<0>. At word line driver 540, a source of transistor 542 is operably coupled to power supply 544, such as Vccp. A source of transistor 541 is configured to receive RF3F<1>.

Additionally, a source of transistor 505 is coupled to an output of word line driver 510 (e.g., an output of transistor 511 or transistor 512) and a drain of transistor 505 is coupled to an output of word line driver 530. Accordingly, in some embodiments, an output voltage of transistor 505 may be configured to provide an activation voltage and/or a deactivation voltage for word line 539.

Similarly, a source of transistor 506 is coupled to an output of word line driver 520 (e.g., an output of transistor 521 or transistor 522) and a drain of transistor 506 is coupled to an output of word line driver 540. Accordingly, in some embodiments, an output voltage of transistor 506 may be configured to provide an activation voltage and/or a deactivation voltage for word line 549.

In various embodiments, word line drivers in word line driver system 500 are main word line drivers (also referred to as global word line drivers). However, in various embodiments, word line drivers in word line driver system are sub-word line drivers (also referred to as local word line drivers). In general, each of the word lines that extend through a memory array may be relatively long and, as a result, may have substantial capacitance. Furthermore, the word lines may be fabricated of polysilicon, which may have a relatively high resistance. The combination of the relatively high capacitance and relatively high resistance of the word lines may make it difficult for the global word line driver to quickly switch signal levels on the word lines, particularly in portions of the memory cell array that are more distant from the global word line driver. To alleviate this problem, it is conventional for memory cell arrays to be divided into smaller memory cell arrays, and to fabricate local word line drivers between at least some of these smaller memory cell arrays. The local word line drivers may receive substantially the same signals that are used to control the global word line drivers to drive the word lines so that they may apply the same levels to the word lines that the global word line driver applies to the word lines.

Figure 6:
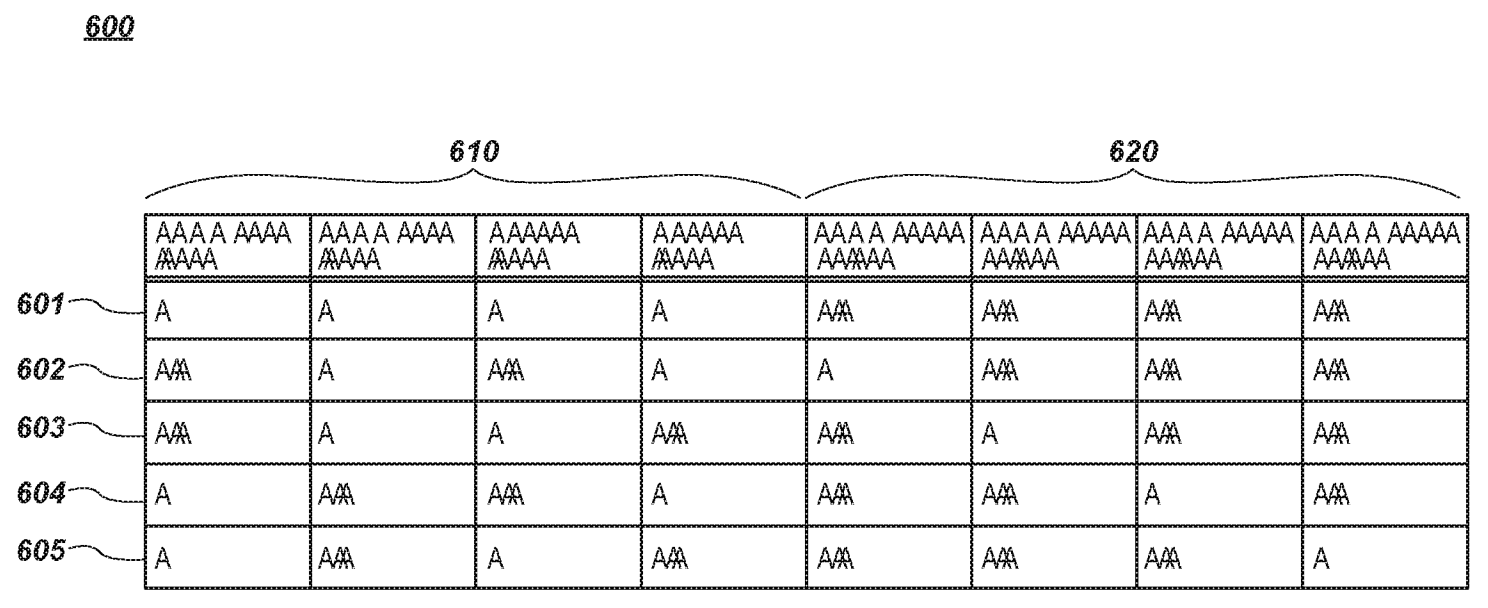

As described above, word line driver system 500 includes transistors that are selectively turned ON/OFF which results in a desired output signal (e.g., an ARMWLF signal) that activates or deactivates a respective word line. FIG. 6 shows a logic table 600 associated with word line drivers of word line driver system 500 of FIG. 5. For example, logic table 600 shows HIGH/LOW voltages (e.g., logical ON/OFF) that enables the transistors of word line driver system 500 to be selectively turned ON/OFF. As a result, a desired output signal (e.g., an ARMWLF signal) activates or deactivates a respective word line.

Logic table 600 includes values of input signals 610, for example, pre-decoding signals ARML signals and RF3 signals. Pre-decoding signals, RF3F, are not shown because RF3F is a complement of RF3, as described above. Logic table 600 also includes values of output signals 620, for example, ARMWLF signals that activate or deactivate respective word lines. In one embodiment, activation signals may be LOW voltage signals (e.g., 0V) and deactivation signals may be HIGH voltage signals (e.g., 3.2V). Alternatively, in other embodiments, deactivation signals may be LOW voltage signals (e.g., 0V) and activation signals may be HIGH voltage signals (e.g., 3.2V).

Row 601 of logic table 600 corresponds to each word line in word line driver system 500 in a standby state. That is, each word line (e.g., word lines 519, 529, 539 and 549) is driven by a HIGH voltage signal, for example, a deactivate voltage of 3.2V. In particular, output signal ARMWLF<0> corresponding to an output of word line driver 510 is at 3.2V, output signal ARMWLF<1> corresponding to an output of word line driver 520 is at 3.2V, output signal ARMWLF<2> corresponding to an output of word line driver 530 is at 3.2V, and output signal ARMWLF<3> corresponding to an output of word line driver 540 is at 3.2V.

Row 602 of logic table 600 corresponds to word line 519 of word line driver system 500 in an active state (and word lines 529, 539 and 549 are in a deactive/standby state). In particular, output signal ARMWLF<0> corresponding to word line driver 510 is at 0V, and output signals ARMWLF<1>, ARMWLF<2>, ARMWLF<3> are at 3.2V.

Row 603 of logic table 600 corresponds to word line 529 of word line driver system 500 in an active state because ARMWLF<1> is 0V (and word lines 519, 539 and 549 are in a deactive/standby state). Row 604 of logic table 600 corresponds to word line 539 of word line driver system 500 in an active state because ARMWLF<2> is at 0V (and word lines 519, 529 and 549 are in a deactive/standby state). Row 605 of logic table 600 corresponds to word line 549 of word line driver system 500 in an active state because ARMWLF<3> is at 0V (and word lines 519, 529 and 539 are in a deactive/standby state).

As described above, an output voltage of transistor 505 may be used to provide an activation voltage or a deactivation voltage for word line 539. For example, at word line driver 530, a drain of transistor of 531 and 532 is at 0V.

However, when transistor 505 is turned ON and a source of transistor 505 is at 3.2V (e.g., an output of word line driver 510 is at 3.2V), word line 539 is pulled to 3.2V. As such, word line 539 is pulled to 3.2V (while a drain of transistors 531 and 532 is at 0V). Such an example can be provided via input signals as described in row 605 of logic table 600. In a similar fashion, an output voltage of transistor 506 may be used to provide an activation voltage and/or a deactivation voltage for word line 549.

Figure 7:
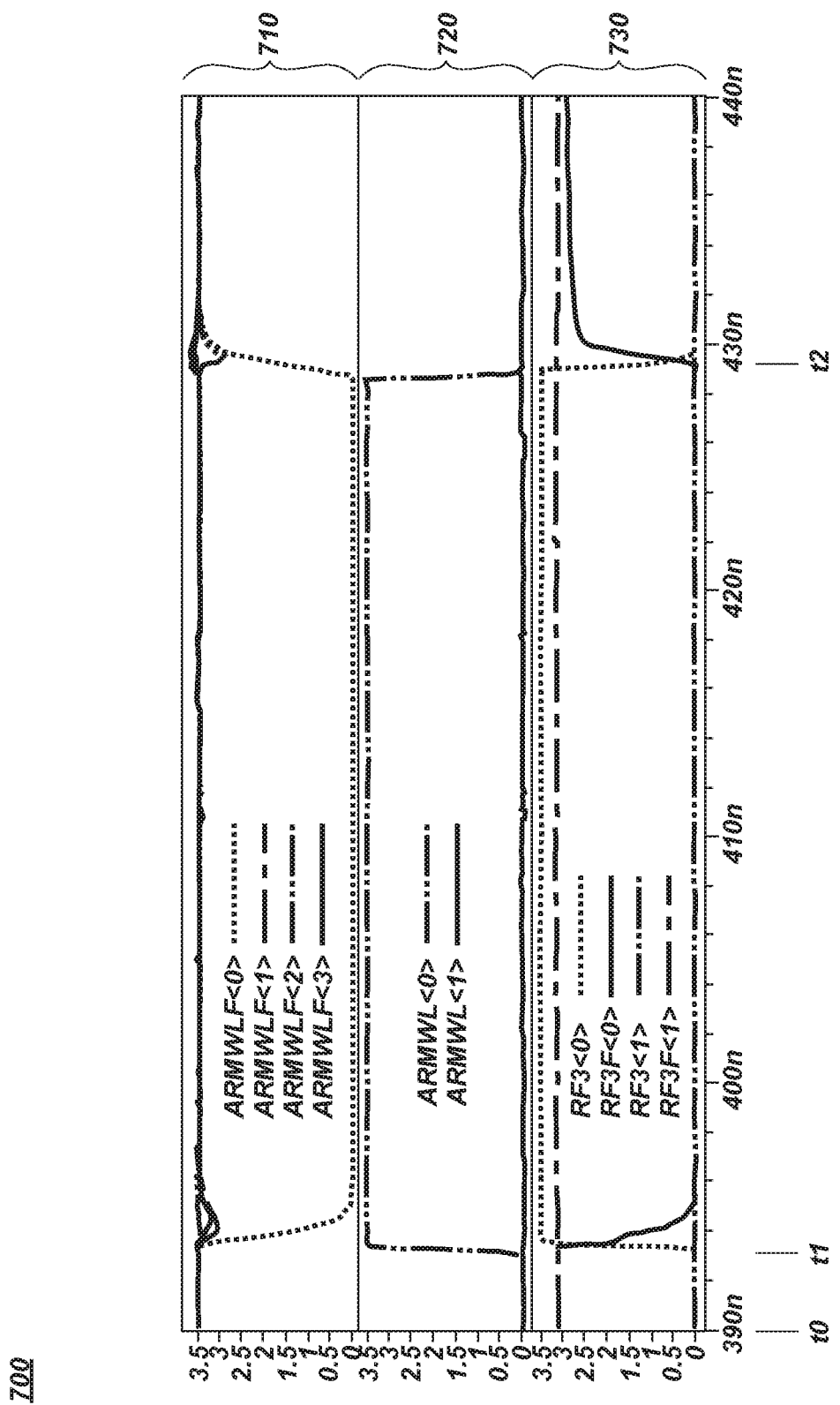
FIG. 7 is a timing diagram associated with the word line driver system of FIG. 5, in accordance with various embodiments of the present disclosure.

FIG. 7 show a signal timing diagram 700 associated with word line driver system 500 of FIG. 5. In particular, signal timing diagram 700 includes timing of input signals 610 and output signals 620 corresponding to row 602 (see. FIG. 6). Signal timing diagram 700 includes a graph 710 showing output signals ARMWLF, a graph 720 showing pre-decoding signals ARMWL, and a graph 730 showing pre-decoding signals RF3 and RF3F.

Referring to FIGS. 5, 6 and 7, at time, t0, word lines 519, 529, 539 and 549 are in a standby state. That is, ARMWLF<0> through ARMWLF<3> are at a HIGH voltage, for example, 3.2V. As such, word lines 519, 529, 539 and 549 are in a standby/deactivated state. Word lines 519 through 549 are in a standby state based responsive to ARMWL<0> at 0V, ARMWL<1> at 0V, RF3<0> at 0V, and RF3<1> at 0V.

At time, t1, ARMWLF<0> is at a LOW voltage, for example, 0V. As such, word line 519 is in an activated state (while word lines 529, 539 and 549 remain in a standby state). Referring to logic table 600 (see FIG. 6) and signal timing diagram 700 (see FIG. 7), ARMWLF<0> is in an activated state (and ARMWLF<1> through ARMWLF<3> are in a deactivated state) based on ARMWL <0> at 3.2V, ARMWL<1> at 0V, RF3<0> at 3.2V and RF3<1> at 0V.

At time, t2, ARMWLF<0> through ARMWLF<3> are at a HIGH voltage, for example, at 3.2V. As such, word lines 519, 529, 539 and 549 are in a standby/deactivated state. For example, ARMWL <0> changes to 0V (from 3.2V), RF3<0> changes to 0V (from 3.2V) and RF3F<0> changes to 3.2V (from 0V).

Figure 8:
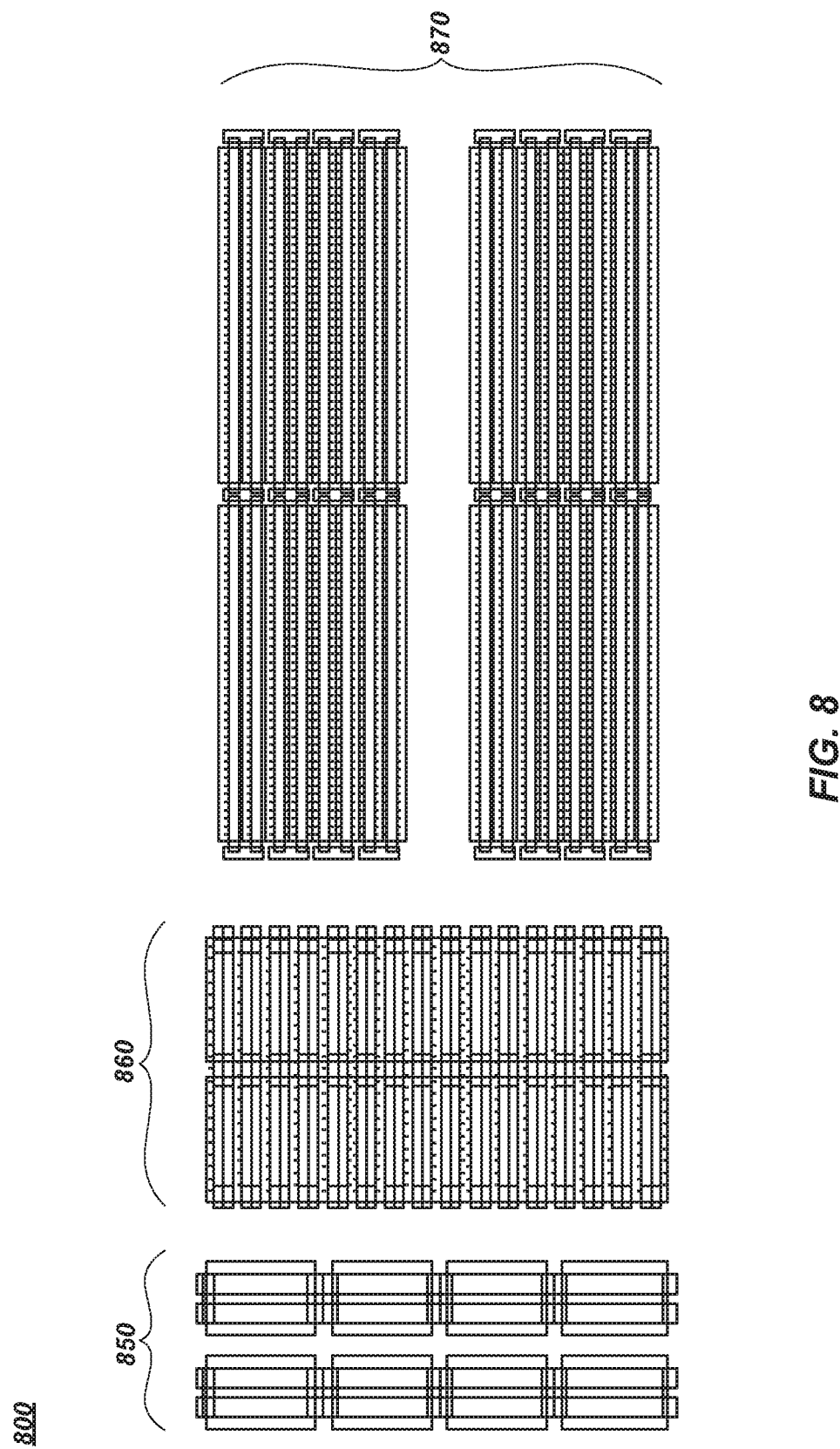
FIG. 8 is a schematic illustrating transistor placement of a word line driver system, in accordance with various embodiments of the present disclosure.

FIG. 8 is a diagram illustrating transistor placement of a word line driver system 800, in accordance with various embodiments of the present disclosure. Word line driver system 800 includes 16 word line drivers (including shared transistors). For example, word line driver system 800 includes four word line driver systems 500. Word line driver system 800 includes 8 PMOS transistors 850, 16 PMOS transistors 860 and 16 NMOS transistors 870. In particular, word line driver system 800 includes less PMOS transistors than word line driver system 400B of FIG. 4B (e.g., 8 PMOS transistors 850 compared to 16 PMOS transistors 450). As such, word line driver system 800 has a greater area efficiency than word line driver system 400B.

Figure 9:
FIG. 9 is a simplified block diagram of a semiconductor device, in accordance with various embodiments of the present disclosure.

FIG. 9 is a simplified block diagram of a memory system 900 implemented according to one or more embodiments described herein. Memory system 900 includes a memory module including a number of memory devices 902 and a control logic component 904. For example, memory devices 902 may include memory devices 102-105 of FIG. 1, memory device 200 memory device 300, word line driver system 500 of FIG. 5, and/or word line driver system 800 of FIG. 8, and control logic component 904 may include controller 112 of FIG. 1. Control logic component 904 may be operatively coupled with the memory devices 902 so as to read, write, or re-fresh any or all memory cells within memory devices 902.

Figure 10:
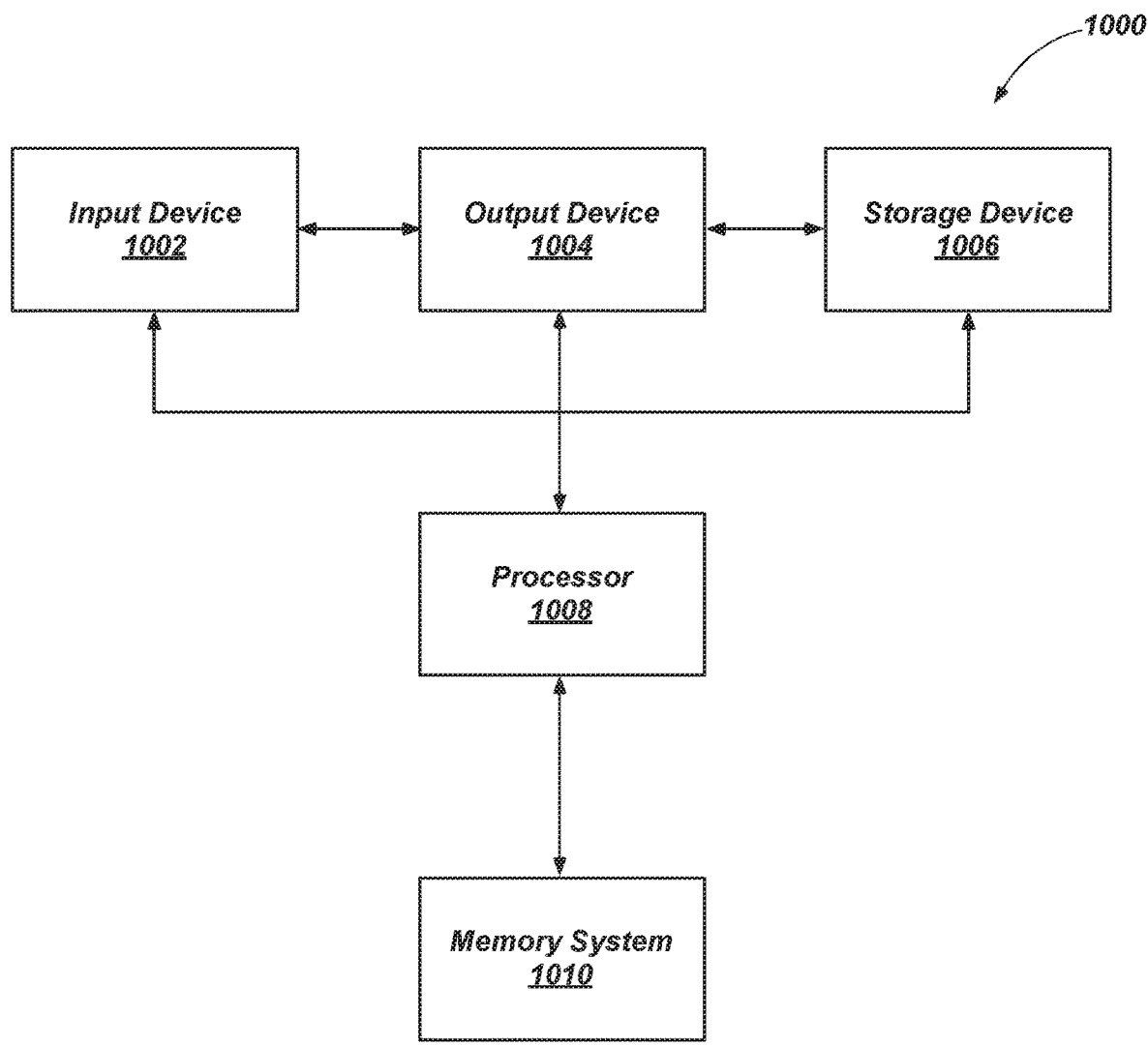
FIG. 10 is a simplified block diagram of an electronic system, in accordance with various embodiments of the present disclosure.

An electronic system is also disclosed. The electronic system may include memory system including a number of memory devices. FIG. 10 is a simplified block diagram of an electronic system 1000 implemented according to one or more embodiments described herein. Electronic system 1000 includes at least one input device 1002. Input device 1002 may be a keyboard, a mouse, or a touch screen. Electronic system 1000 further includes at least one output device 1004. Output device 1004 may be a monitor, touch screen, or speaker. Input device 1002 and output device 1004 are not necessarily separable from one another. Electronic system 1000 further includes a storage device 1006. Input device 1002, output device 1004, and storage device 1006 are coupled to a processor 1008.

Electronic system 1000 further includes a memory system 1010 coupled to processor 1008. Memory system 1010, which may include memory system 100 of FIG. 1 including memory devices (e.g., memory device 102-105 of FIG. 1), memory device 200 of FIG. 2, memory device 300 of FIG. 3, word line driver system 500 of FIG. 5, and/or word line driver system 800 of FIG. 8. Electronic system 1000 may be include a computing, processing, industrial, or consumer product. For example, without limitation, electronic system 1000 may include a personal computer or computer hardware component, a server or other networking hardware component, a handheld device, a tablet computer, an electronic notebook, a camera, a phone, a music player, a wireless device, a display, a chip set, a game, a vehicle, or other known systems.

One or more embodiments of the present disclosure include a memory device. The memory device comprises a first word line driver coupled to a first word line, a second word line driver coupled to a second word line, and a first transistor. The first transistor comprises a first terminal coupled to an output of the first word line driver, and a second terminal coupled to an output of the second word line driver.

One or more embodiments of the present disclosure include a word line driver system. The word line driver system includes a first PMOS transistor comprising a gate configured to receive a first memory address signal, a source coupled to an output of a first word line driver, and a drain coupled to an output of a second word line driver.

One or more embodiments of the present disclosure include an electronic system comprising at least one input device, at least one output device, at least one processor device operably coupled to the input device and the output device, and at least one memory device operably coupled to the at least one processor device. The at least one memory device comprising at least one pair of word line drivers, wherein one word line driver of the pair is coupled to a first word line and an output of the one word line driver of the pair is coupled to a first terminal of a transistor, and another word line driver of the pair is coupled to a second word line and an output of the other word line driver of the pair is coupled to a second terminal of the transistor.

In accordance with common practice, the various features illustrated in the drawings may not be drawn to scale. The illustrations presented in the present disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

Terms used herein and especially in the appended claims (e.g., body of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. As used herein, "and/or" includes any and all combinations of one or more of the associated listed items.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms first," "second," "third," etc., connote a specific number of elements, these terms should not be understood to connote a specific number of elements.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. A memory device, comprising:
   a first word line driver coupled to a first word line and configured to receive a first pre-decoding signal;
   a second word line driver coupled to a second word line and configured to receive a second pre-decoding signal different than the first pre-decoding signal;
   a first PMOS transistor comprising:
      a first terminal coupled to a first output terminal of the first word line driver; and
      a second terminal coupled to a second output terminal of the second word line driver; and
   a third word line driver coupled to a third word line and configured to receive the first pre-decoding signal;
   a fourth word line driver coupled to a fourth word line and configured to receive the second pre-decoding signal; and
   a second PMOS transistor comprising:
      a third terminal coupled to a third output terminal of the third word line driver; and
      a fourth terminal coupled to a fourth output terminal of the fourth word line driver.

2. The memory device of claim 1, wherein the first PMOS transistor further comprises a third terminal configured to receive a memory address signal.

3. The memory device of claim 1, wherein the first word line driver comprises:
   a third PMOS transistor configured to receive the first pre-decoding signal at a first gate thereof; and
   a first NMOS transistor configured to receive the first pre-decoding signal at a second gate thereof and configured to receive a third pre-decoding signal at a first input terminal thereof.

4. The memory device of claim 3, wherein the third PMOS transistor further comprises a second input terminal coupled to a voltage rail.

5. A memory device, comprising:
   a first word line driver coupled to a first word line, the first word line driver comprising;
      a first transistor comprising:
         a first terminal configured to receive a first memory address signal; and
         a second terminal;
      a second transistor comprising:
         a third terminal configured to receive a second memory address signal;
         a fourth terminal coupled to the second terminal of the first transistor; and
         a fifth terminal configured to receive a third memory address signal;
   a second word line driver coupled to a second word line; and
   a third transistor comprising:
      a sixth terminal coupled to a first output terminal of the first word line driver; and
      a seventh terminal coupled to a second output terminal of the second word line driver and configured to receive a fourth memory address signal that is a complement of the third memory address signal received at the fifth terminal of the second transistor of the first word line driver.

6. The memory device of claim 3, wherein the second word line driver comprises:
   a fourth PMOS transistor configured to receive the second pre-decoding signal at a third gate thereof; and
   a second NMOS transistor configured to receive the second pre-decoding signal at a fourth gate thereof and configured to receive the third pre-decoding signal at a second input terminal thereof.

7. A word line driver system, comprising:
   a first PMOS transistor comprising:
      a gate configured to receive a first memory address signal;
      a source coupled to an output of a first word line driver; and
      a drain coupled to an output of a second word line driver; and
   a second PMOS transistor comprising:
      a gate configured to receive a second memory address signal;
      a source coupled to an output of a third word line driver; and
      a drain coupled to an output of a fourth word line driver, wherein:
         the first word line driver and the third word line driver are configured to receive a first input signal; and
         the second word line driver and the fourth word line driver are configured to receive a second input signal different than the first input signal.

8. The word line driver system of claim 7, wherein the source of the first PMOS transistor is coupled to a drain of a second PMOS transistor of the first word line driver and a drain of a first NMOS transistor of the first word line driver.

9. The word line driver system of claim 8, wherein the drain of the first PMOS transistor is coupled to a drain of a third PMOS transistor of the second word line driver and a drain of a second NMOS transistor of the second word line driver.

10. The word line driver system of claim 7, wherein the source of the second PMOS transistor is coupled to a drain of a third PMOS transistor of the third word line driver and a drain of a first NMOS transistor of the third word line driver.

11. The word line driver system of claim 10, wherein the drain of the second PMOS transistor is coupled to a drain of a fourth PMOS transistor of the fourth word line driver and a drain of a second NMOS transistor of the fourth word line driver.

12. An electronic system, comprising:
   at least one input device;
   at least one output device;
   at least one processor device operably coupled to the input device and the output device; and
   at least one memory device operably coupled to the at least one processor device and comprising:
      a first transistor;
      a first pair of word line drivers coupled to the first transistor and comprising:
         a first word line driver coupled to a first word line and configured to receive a first input signal and to send a first output signal to a first terminal of the first transistor; and
         a second word line driver coupled to a second word line and configured to receive a second input signal and to send a second output signal to a second terminal of the first transistor;
      a second transistor; and
      a second pair of word line drivers coupled to the second transistor and comprising:
         a third word line driver coupled to a third word line and configured to receive the first input signal and to send a third output signal to a first terminal of the second transistor; and a fourth word line driver coupled to a fourth word line and configured to receive the second input signal and to send a fourth output signal to a second terminal of the second transistor.

13. The electronic system of claim 12, wherein:
the first word line driver comprises:
   a first PMOS transistor comprising:
      a first gate configured to receive the first input signal;
      a first source operably coupled to a voltage supply; and
      a first drain;
   a first NMOS transistor comprising:
      a second gate configured to receive the first input signal;
      a second source configured to receive a third input signal; and
      a second drain operably coupled to the first drain of the first PMOS transistor;
the second word line driver comprises:
   a second PMOS transistor comprising:
      a third gate configured to receive the second input signal;
      a third source operably coupled to the voltage supply; and
      a third drain;
   a second NMOS transistor comprising:
      a fourth gate configured to receive the second input signal;
      a fourth source configured to receive the third input signal; and
      a fourth drain operably coupled to the third drain of the second PMOS transistor; and
the first transistor comprises a third PMOS transistor comprising:
   a fifth gate;
   a fifth source operably coupled to the first drain of the first PMOS transistor and the second drain of the first NMOS transistor; and
   a fifth drain operably coupled to the third drain of the second PMOS transistor and the fourth drain of the second NMOS transistor.

14. The electronic system of claim 13, wherein:
the third word line driver comprises:
   a fourth PMOS transistor comprising:
      a sixth gate configured to receive the first input signal;
      a sixth source operably coupled to the voltage supply; and
      a sixth drain;
   a third NMOS transistor comprising:
      a seventh gate configured to receive the first input signal;
      a seventh source configured to receive a fourth input signal; and
      a seventh drain operably coupled to the sixth drain of the fourth PMOS transistor; and
the fourth word line driver comprises:
   a fifth PMOS transistor comprising:
      an eighth gate configured to receive the second input signal;
      an eighth source operably coupled to the voltage supply; and
      an eighth drain;
   a fourth NMOS transistor comprising:
      a ninth gate configured to receive the second input signal;
      a ninth source configured to receive the fourth input signal; and
      a ninth drain operably coupled to the eighth drain of the fifth PMOS transistor; and
the second transistor comprises a sixth PMOS transistor comprising:
   a tenth gate;
   a tenth source operably coupled to the sixth drain of the fourth PMOS transistor and the seventh drain of the third NMOS transistor; and
   a tenth drain operably coupled to the eighth drain of the fifth PMOS transistor and the ninth drain of the fourth NMOS transistor.

\* \* \* \* \*

UNITED STATES PATENT AND TRADEMARK OFFICE
CERTIFICATE OF CORRECTION

PATENT NO. : 10,957,369 B2  
APPLICATION NO. : 16/546500  
DATED : March 23, 2021  
INVENTOR(S) : Tae H Kim It is certified that error appears in the above-identified patent and that said Letters Patent is hereby corrected as shown below:

In the Specification  
Column 3, Line 22, change "and/BL" to --and /BL--  
Column 3, Line 24, change "and/BL" to --and /BL--  
Column 3, Line 26, change "and/BL" to --and /BL--  
Column 3, Line 32, change "and/BL" to --and /BL--  
Column 3, Line 33, change "or/BL" to --and /BL--  
Column 3, Line 42, change "or/BL" to --and /BL--  
Column 4, Line 22, change "and/CK" to --and /CK--

Signed and Sealed this  
First Day of June, 2021

Drew Hirshfeld  
*Performing the Functions and Duties of the*  
*Under Secretary of Commerce for Intellectual Property and*  
*Director of the United States Patent and Trademark Office*